United States Patent
Sung et al.

(10) Patent No.: US 9,318,599 B2
(45) Date of Patent: Apr. 19, 2016

(54) POWER SEMICONDUCTOR DEVICE

(71) Applicant: Samsung Electro-Mechanics Co., Ltd., Suwon (KR)

(72) Inventors: Jae Kyu Sung, Suwon (KR); Jae Hoon Park, Suwon (KR); Kee Ju Um, Suwon (KR); In Hyuk Song, Suwon (KR)

(73) Assignee: SAMSUNG ELECTRO-MECHANICS CO., LTD., Suwon (KR)

( * ) Notice: Subject to any disclaimer, the term of this patent is extended or adjusted under 35 U.S.C. 154(b) by 0 days.

(21) Appl. No.: 14/331,603

(22) Filed: Jul. 15, 2014

(65) Prior Publication Data
US 2015/0076595 A1  Mar. 19, 2015

(30) Foreign Application Priority Data
Sep. 16, 2013  (KR) .................. 10-2013-0111140

(51) Int. Cl.
*H01L 29/78* (2006.01)
*H01L 29/423* (2006.01)
*H01L 29/10* (2006.01)
*H01L 29/06* (2006.01)

(52) U.S. Cl.
CPC ........ *H01L 29/7813* (2013.01); *H01L 29/0615* (2013.01); *H01L 29/1095* (2013.01); *H01L 29/4236* (2013.01)

(58) Field of Classification Search
CPC ............ H01L 29/0615; H01L 29/1095; H01L 29/4236; H01L 29/7813
USPC ........... 257/334, 77, 133, 331, 328, 139, 192, 257/330; 438/259, 156, 270; 361/187; 327/389
See application file for complete search history.

(56) References Cited

U.S. PATENT DOCUMENTS

| | | | | |
|---|---|---|---|---|
| 4,571,512 | A * | 2/1986 | Schutten et al. | 327/389 |
| 5,241,194 | A * | 8/1993 | Baliga | 257/133 |
| 5,703,384 | A * | 12/1997 | Brunner | 257/139 |
| 5,894,149 | A * | 4/1999 | Uenishi et al. | 257/331 |
| 2005/0258493 | A1 | 11/2005 | Aono et al. | |
| 2007/0187695 | A1 * | 8/2007 | Nakamura et al. | 257/77 |
| 2009/0020852 | A1 * | 1/2009 | Harada | 257/579 |
| 2015/0029627 | A1 * | 1/2015 | Mauder et al. | 361/87 |

FOREIGN PATENT DOCUMENTS

| | | |
|---|---|---|
| KR | 10-0223198 | 10/1999 |
| KR | 10-2006-0047492 | 5/2006 |

* cited by examiner

*Primary Examiner* — Mohammed Shamsuzzaman

(57) ABSTRACT

A power semiconductor device may include: a first conductive type drift layer in which trench gates are formed; a second conductive type well region formed on the drift layer so as to contact the trench gate; a first conductive type source region formed on the well region so as to contact the trench gate; and a device protection region formed below a height of a lowermost portion of the source region in a height direction.

11 Claims, 8 Drawing Sheets

POWER SEMICONDUCTOR DEVICE

CROSS-REFERENCE TO RELATED APPLICATION

This application claims the benefit of Korean Patent Application No. 10-2013-0111140 filed on Sep. 16, 2013, with the Korean Intellectual Property Office, the disclosure of which is incorporated herein by reference.

BACKGROUND

The present disclosure relates to a power semiconductor device having a high level of reliability.

In general, a power semiconductor device has been widely used to control a motor or used in various switching devices such as an inverter, or the like.

In detail, the power semiconductor device, a semiconductor device used in a power apparatus, is a core component of the power apparatus optimized for the conversion or controlling of power.

The power semiconductor device has a high blocking voltage, a high current, and a high frequency as compared to a general semiconductor device.

As representative power semiconductor devices, there are provided a metal oxide semiconductor field effect transistor (MOSFET), an insulated gate bipolar transistor (IGBT), and the like.

Such an IGBT and MOSFET basically have an n-p-n junction structure. That is, since n-p-n junctions are formed between two diodes so that rectification directions are opposite to each other, current does not flow.

However, when a positive (+) voltage is applied to a gate insulated from a p-type semiconductor region using oxides, electrons present in the p-type semiconductor regions are attracted, such that a conductive channel is formed in a portion at which the p-type semiconductor region and the oxides contact each other.

Current may flow between an emitter and a collector or a source and a drain.

Particularly, the IGBT means a transistor manufactured so as to have bipolarity by forming a gate using a metal oxide semiconductor (MOS) and forming a p-type collector layer on a rear surface thereof.

More specifically, an operational principle of the IGBT will be described. When a voltage higher than a threshold voltage of the IGBT device is applied to a gate electrode, a polarity of a surface of a p-type body region positioned at a lower end of the gate electrode is inversed, and accordingly an n-type channel is formed, such that a current may flow between an anode and a cathode.

An electron current injected into a drift region though the channel induces injection of a hole current from a high-concentration p-type collector layer positioned below the IGBT device, similar to a base current of the bipolar transistor.

Due to injection of these minority carriers at a high concentration, a conductivity modulation in which conductivity in the drift region is increased several ten or several hundred times occurs.

Unlike MOSFETs, in case of IGBTs, a resistance component in the drift region may be significantly reduced in size due to the conductivity modulation. Therefore, the IGBT may be used with very high voltages.

Since IGBTs have characteristics such as a low forward loss and rapid switching speeds, the application of IGBTs to fields that may to which existing thyristors, bipolar transistors, MOSFETs, and the like, has increased.

Generally, a power semiconductor device is composed of hundreds of thousands to millions of cells in a single device.

In such a power semiconductor device, since in the case in which latch-up or a short-circuit occurs in a single cell, there is no structure insulating adjacent cells from each other, the entire device is broken.

In the case in which the above-mentioned latch-up or short-circuit occurs, a high degree of heat may be generated in a portion corresponding to a junction of the device.

In an extreme case, a temperature of the corresponding portion is increased to 1400° C. or more due to heat generated at the junction.

Since a melting point of silicon (Si) is 1414° C., the corresponding portion of the device may be completely broken, such that the entire device may be unusable.

Therefore, a technology of cutting off a cell in which a problem occurs before the device becomes unusable due to breakage of the corresponding cell caused by latch-up or a short-circuit in the cell has been required.

A semiconductor apparatus has been disclosed in the following Related Art Document (Patent Document 1).

A semiconductor apparatus having a high breakdown voltage has been disclosed in Patent Document 1.

In detail, the semiconductor apparatus disclosed in Patent Document 1 is characterized in that carrier density may be increased in the vicinity of an emitter and a high breakdown voltage may be obtained by disposing an insulation layer between gate trenches arranged at a predetermined pitch.

However, in the semiconductor apparatus disclosed in Patent Document 1, a region having electrical insulation properties is formed in advance, which is different from the present disclosure in that a device protection layer of the present disclosure may be a region capable of being electrically conducted before a high level of heat is generated due to latch-up or a short-circuit.

RELATED ART DOCUMENT (Patent Document 1) Korean Patent Publication No. 10-0223198

SUMMARY

An aspect of the present disclosure may provide a power semiconductor device capable of cutting off a cell in which a problem occurs when a high level of heat is generated due to latch-up or a short-circuit at the time of an operation of the device.

According to an aspect of the present disclosure, a power semiconductor device may include: a first conductive type drift layer in which trench gates are formed; a second conductive type well region formed on the drift layer so as to contact the trench gate; a first conductive type source region formed on the well region so as to contact the trench gate; and a device protection region formed below a height of a lowermost portion of the source region in a height direction.

The device protection region may be formed below the source region.

The device protection region may be formed in the well region.

The power semiconductor device may further include a channel region formed in a portion of the well region contacting the trench gate when the device is turned on, wherein the device protection region is formed in a portion of the channel region.

The device protection region may be formed in a portion at which the drift layer and the well region contact each other.

The power semiconductor device may further include a channel region formed in a portion of the well region contacting the trench gate when the device is turned on, wherein the device protection region is formed below the channel region.

The device protection region may be formed in the drift layer.

The power semiconductor device may further include a channel region formed in a portion of the well region contacting the trench gate when the device is turned on, wherein the device protection region is formed below the channel region in the height direction.

The device protection region may contain at least one of an oxygen atom and a nitrogen atom.

The device protection region may be changed to have insulation properties when latch-up or a short-circuit occurs.

According to another aspect of the present disclosure, a power semiconductor device may include: a first conductive type drift layer; a plurality of trench gates formed lengthwise in the drift layer to be spaced apart by a predetermined interval in one direction; a second conductive type well region between the plurality of the trench gates; first conductive type source regions formed in the well region to be spaced apart by a predetermined interval in one direction so as to contact the trench gate; and a device protection region formed below a height of a lowermost portion of the source region in a height direction.

The device protection region may be formed below the source region.

The device protection region may be formed in the well region.

The power semiconductor device may further include a channel region formed in a portion of the well region contacting the trench gate when the device is turned on, wherein the device protection region is formed in a portion of the channel region.

The device protection region may be formed in a portion at which the drift layer and the well region contact each other.

The power semiconductor device may further include a channel region formed in a portion of the well region contacting the trench gate when the device is turned on, wherein the device protection region is formed below the channel region.

The device protection region may be formed in the drift layer.

The power semiconductor device may further include a channel region formed in a portion of the well region contacting the trench gate when the device is turned on, wherein the device protection region is formed below the channel region in the height direction.

The device protection region may contain at least one of an oxygen atom and a nitrogen atom.

The device protection region may be changed to have insulation properties when latch-up or a short-circuit occurs.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
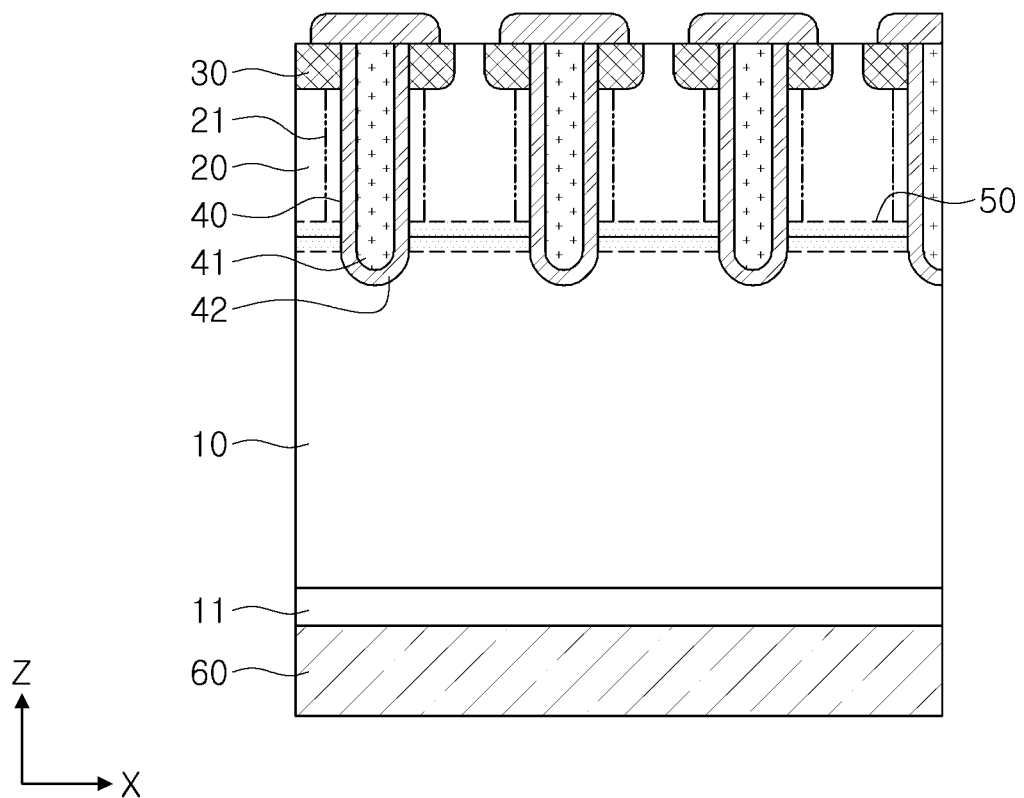
FIG. 1 is a schematic cross-sectional view of a power semiconductor device according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

In the accompanying drawings, x, y, and z directions refer to a width direction, a length direction, and a height direction, respectively.

A power switch may be implemented by any one of a power metal oxide semiconductor field effect transistor (MOSFET), an insulated gate bipolar transistor (IGBT), a thyristor, and devices similar to the above-mentioned devices. Most of new technologies disclosed herein will be described based on the IGBT. However, several exemplary embodiments of the present disclosure disclosed herein are not limited to the IGBT, but most of the exemplary embodiments may also be applied to other types of power switch technologies including a power MOSFET and several types of thyristors in addition to a diode. Further, several exemplary embodiments of the present disclosure will be described as including specific p-type and n-type regions. However, conductive types of several regions disclosed herein may be similarly applied to devices having conductive types opposite thereto.

In addition, an n-type or a p-type used herein may be defined as a first conductive type or a second conductive type. Meanwhile, the first and second conductive types mean different conductive types.

Further, generally, positive '+' refers to the state in which a region is heavily doped and negative '−' refers to the state that a region is lightly doped.

FIG. 1 is a schematic cross-sectional view of a power semiconductor device 100 according to an exemplary embodiment of the present disclosure.

A cross-sectional structure of the power semiconductor device 100 according to an exemplary embodiment of the present disclosure will be described with reference to FIG. 1.

The power semiconductor device 100 according to an exemplary embodiment of the present disclosure may include a first conductive type drift layer 10 in which trench gates 40 are formed; a second conductive type well region 20 formed on the drift layer 10 so as to contact the trench gate 40; a first conductive type source region 30 formed on the well region 20 so as to contact the trench gate 40; and a device protection region 50 formed below a height of a lowermost portion of the source region 30 in the height direction (z direction).

The first conductive type may be an n-type, and the second conductive type may be a p-type.

The drift layer 10 may have low-concentration n-type impurities in order to maintain a blocking voltage of the power semiconductor device.

The well region 20 and the source region 30 may have a source metal layer (not shown) formed on exposed upper surfaces thereof.

The drift layer 10 may have a buffer layer 11 formed therebeneath.

The buffer layer 11 may be an n-type or p-type buffer layer, and in the case in which the buffer layer 11 is an n-type buffer layer, the buffer layer may be operated as a MOSFET, and in the case in which the buffer layer is a p-type buffer layer, the buffer layer 11 may be operated as an IGBT.

The buffer layer 11 may have a collector metal layer 60 formed therebeneath.

The trench gate 40 may be formed by etching the drift layer 10, forming a gate insulation layer 41, and then filling in the gate insulation layer 41 with poly silicon 42.

The device protection region 50 may be formed by injecting an oxygen or nitrogen atoms.

The well region 20 may be formed so as to have second conductive type impurities and the source region 30 may be formed so as to have high-concentration first conductive type impurities.

The source region 30—the well region 20—the drift layer 10 may have an n-p-n junction.

The power semiconductor device 100 may have hundreds of thousands to millions n-p-n junctions, and a single n-p-n junction may operate as a single cell.

In the case in which a voltage is not applied to the trench gate 40, a current does not flow due to the n-p-n junction.

However, in the case in which a positive voltage is applied to the trench gate 40, electrons in the well region 20 may be pulled toward the trench gate 40, such that a conductive channel may be formed at a channel region 21 of the well region 20.

That is, the conductive channel is formed at the channel region 21, such that the current may flow between the source metal layer (not shown) and the collector metal layer 60.

Figure 2:
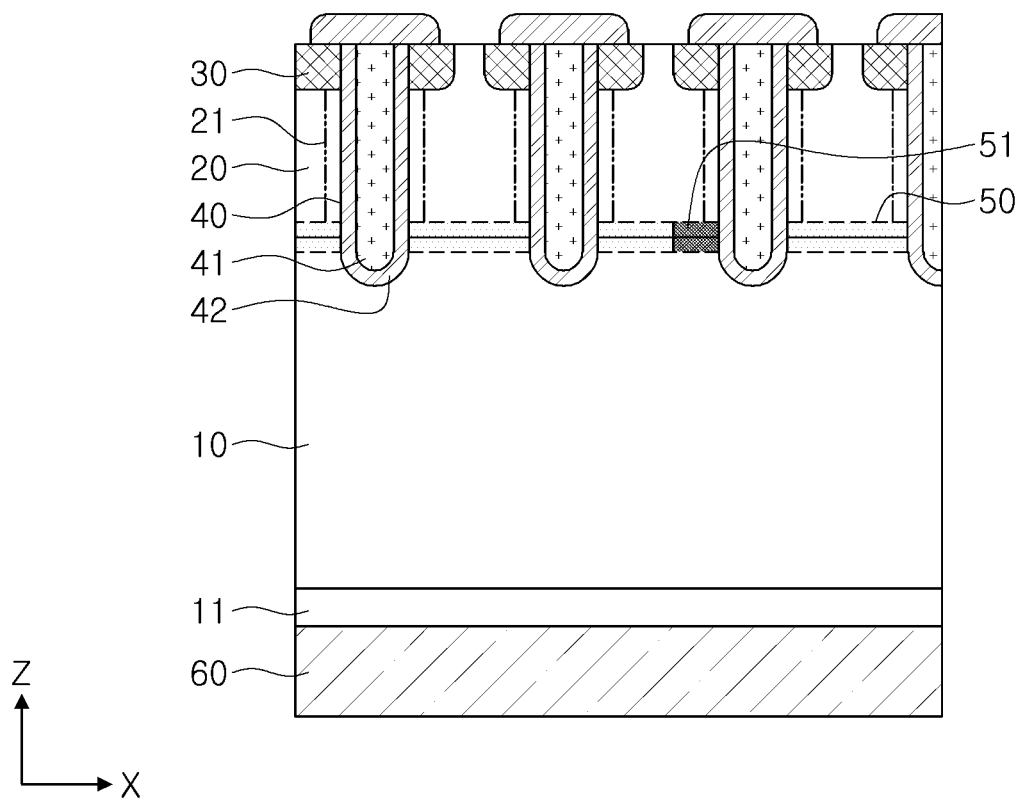
FIG. 2 is a schematic cross-sectional view illustrating a state after a short-circuit or latch-up occurs in the power semiconductor device according to an exemplary embodiment of the present disclosure.

FIG. 2 is a schematic cross-sectional view illustrating a state after a short-circuit or latch-up occurs in the power semiconductor device 100 according to an exemplary embodiment of the present disclosure.

Comparing FIGS. 1 and 2 with each other, it may be appreciated that a portion of the device protection region 50 is changed.

That is, in the case in which a problem such as the short-circuit or latch-up occurs in the cell of the power semiconductor device 100, the portion of the device protection region 50 may be changed into an insulation region 51, such that the cell is permanently cut off, thereby preventing breakage of the entire power semiconductor device 100.

The principle of protecting the device by the device protection region 50 will be described in detail.

In the case in which an error or short-circuit occurs in a circuit controlling a device in the power semiconductor device 100, junction breakage may occur.

Junction breakage means that a high level of heat is generated in a portion at which the drift layer 10 and the well region 20 are bonded to each other, such that the corresponding portion is broken.

Particularly, in the case of the IGBT, since the conductive type of the buffer layer 11 is the p-type, the source region 30—the well region 20—the drift region 10—the buffer layer 11 may have an n-p-n-p junction.

The n-p-n-p junction may operate as a parasitic thyristor in the IGBT.

In the case in which the parasitic thyristor is turned on while the power semiconductor device 100 operates, a significantly large current may flow through the parasitic thyristor.

Therefore, a high level of heat may be generated in a portion at which the drift layer 10 of the cell in which the parasitic thyristor is turned on contacts the well region 20, and furthermore, the cell may be broken, and the entire power semiconductor device 100 may be broken.

A phenomenon that the parasitic thyristor is turned on, and thus, the power semiconductor device 100 is broken as described above is referred to as latch-up.

That is, in the case in which the short-circuit or latch-up occurs in the cell, a high level of heat may be generated in the cell, and furthermore, the entire power semiconductor device 100 may be broken.

In order to prevent the entire power semiconductor device 100 from being broken due to the shirt circuit or latch-up occurring in a small number of cells among the plurality of cells in the power semiconductor device 100, in the power semiconductor device 100 according to an exemplary embodiment of the present disclosure, the device protection region 50 may be formed below a height of a lowermost portion of the source region 30 in the height direction (z direction).

The device protection region 50 may be formed by injecting the oxygen or nitrogen atoms.

In the case in which the a problem such as the short-circuit or latch-up occurs in the power semiconductor device 100, a high level of heat of maximum 1400° C. or more may be generated in the cell corresponding to the portion at which the problem occurs.

On the contrary, since silicon oxide ($SiO_2$) or silicon nitride (SiN) is formed at about 700 to 1000° C., the device protection region 50 may be changed into the insulation region 51 formed of the silicon oxide or silicon nitride before a temperature of the portion at which the problem occurs reaches 1400° C.

Since the silicon oxide or silicon nitride has insulation properties that silicon oxide or silicon nitride does not conduct electricity, the current flowing to the cell in which the problem occurs may be permanently cut off.

That is, since the oxygen or nitrogen atoms are present in an atomic state in the device protection region 50 before the short-circuit or latch-up occurs, the device protection region 50 may operate as a conductive region through which a current flows.

However, since in the device protection region 50 after short-circuit or latch-up occurs, the oxygen or nitrogen atoms are bound to silicon to thereby be changed into a silicon oxide or silicon nitride state, the device protection region 50 may become the insulation region 51 through which the current does not flow.

First Exemplary Embodiment

Figure 3:
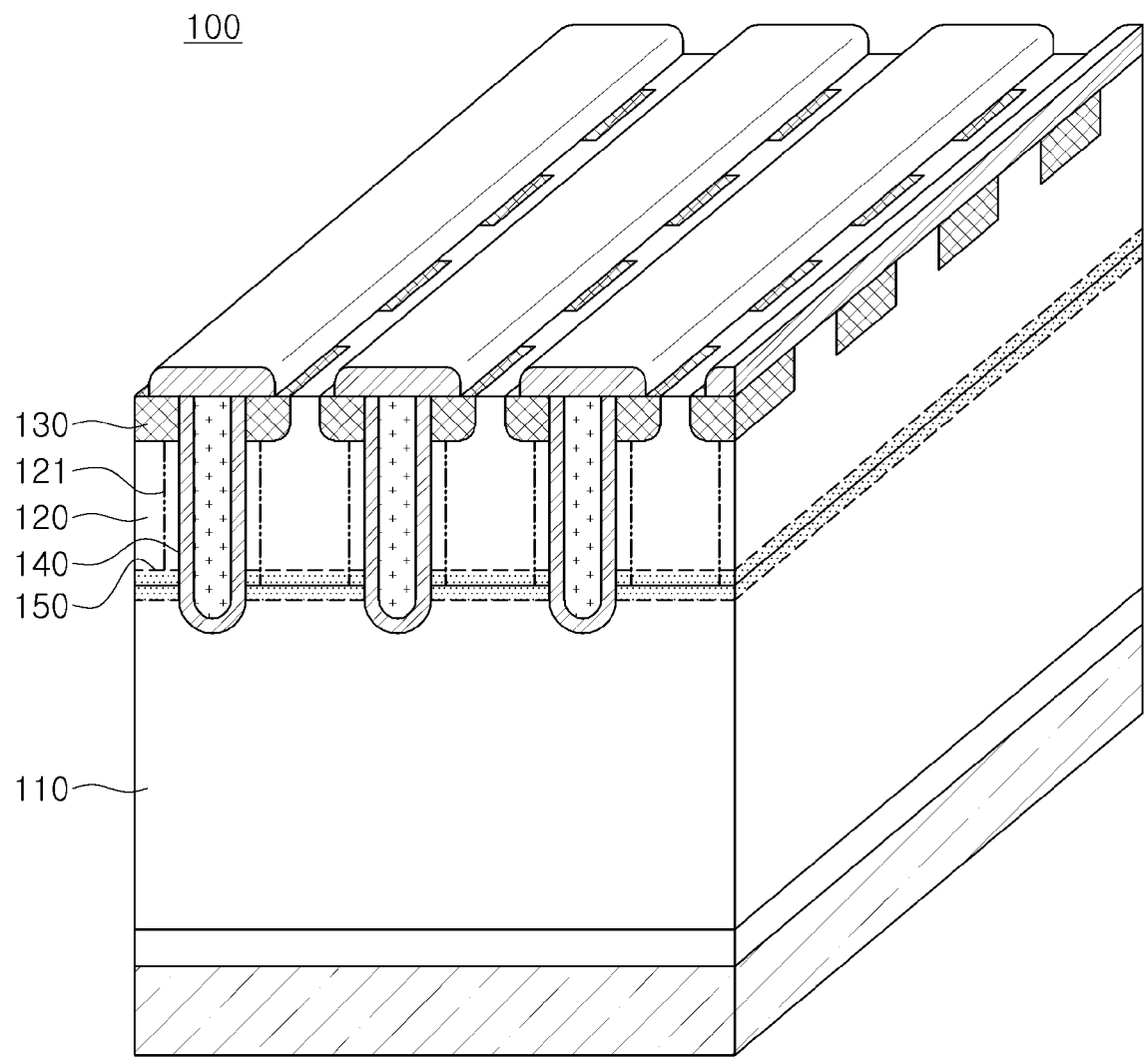
FIG. 3 is a schematic perspective view of a power semiconductor device according to a first exemplary embodiment of the present disclosure.

FIG. 3 is a schematic perspective view of a power semiconductor device 100 according to a first exemplary embodiment of the present disclosure.

Referring to FIG. 3, the power semiconductor device 100 according to a first exemplary embodiment of the present disclosure may include an n− type drift layer 110 in which trench gates 140 are formed; a p0 type well region 120 formed on the drift layer 110 so as to contact the trench gate 140; an n+ type source region 130 formed on the well region 120 so as to contact the trench gate 140; and a device protection region 150 formed below a height of a lowermost portion of the source region 130 in a height direction (z direction), wherein the device protection region 150 may be formed at the all of the portions at which the drift layer 110 and the well region 120 contact each other.

That is, the device protection region 150 of the power semiconductor device 100 according to a first exemplary embodiment may be formed so as to be positioned between the drift layer 110 and the well region 120.

Referring to FIG. 1, in the power semiconductor device 100 according to a first exemplary embodiment, since the device protection region 150 is formed at all of the portions at which the drift layer 110 and the well region 120 contact each other, reliability of the power semiconductor device 100 may be significantly increased.

Particularly, in the case in which a problem such as a short-circuit or latch-up occurs in the power semiconductor device 100, heat may be generated at the portion at which the drift layer 110 and the well region 120 contact each other, such that the corresponding portion may be broken by heat.

This phenomenon is referred to as junction breakage. In the power semiconductor device 100 according to a first exemplary embodiment, the device protection region 150 is formed at the portion at which the drift layer 110 and the well region 120 contact each other, such that generation of the junction breakage as described above may be prevented.

Second Exemplary Embodiment

Figure 4:
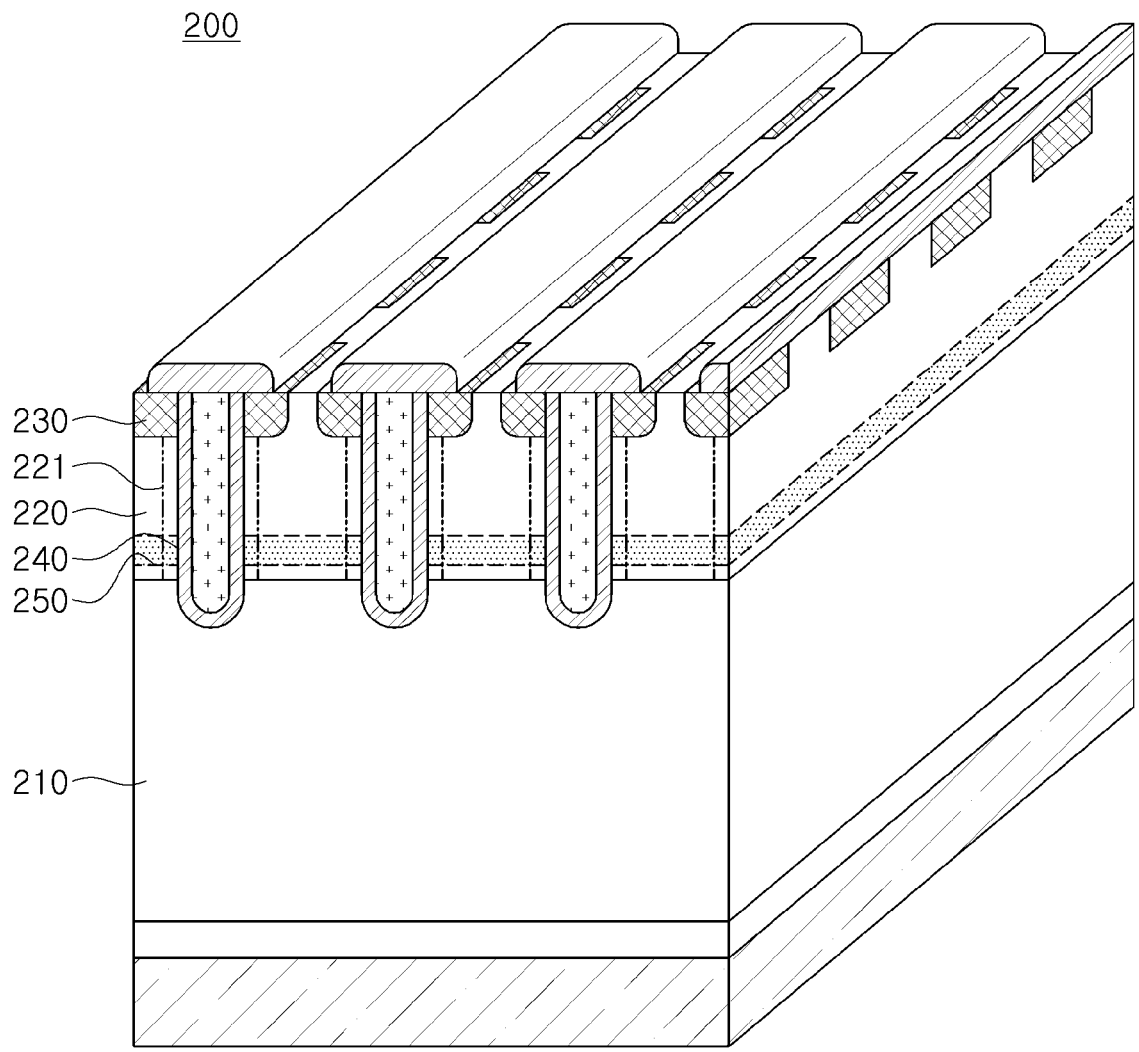
FIG. 4 is a schematic perspective view of a power semiconductor device according to a second exemplary embodiment of the present disclosure.

FIG. 4 is a schematic perspective view of a power semiconductor device 200 according to a second exemplary embodiment of the present disclosure.

Referring to FIG. 4, the power semiconductor device 200 according to a second exemplary embodiment of the present disclosure may include an n− type drift layer 210 in which trench gates 240 are formed; a p0 type well region 220 formed on the drift layer 210 so as to contact the trench gate 240; an n+ type source region 230 formed on the well region 220 so as to contact the trench gate 240; and a device protection region 250 formed below a height of a lowermost portion of the source region 230 in a height direction (z direction), wherein the device protection region 250 may be formed in the well region 220.

In the power semiconductor device 200 according to a second exemplary embodiment of the present disclosure, since the device protection region 250 is formed in the well region 220 in which a channel region 221 is positioned, when a problem such as a short-circuit or latch-up occurs, the channel region 221 may be directly insulated.

Therefore, when the problem such as the short-circuit or latch-up occurs, since only the cell at which the problem occurs may be permanently cut off, even in the case in which the device protection region 250 is changed into an insulation region, performance of the power semiconductor device 200 according to a second exemplary embodiment may be hardly deteriorated.

Third Exemplary Embodiment

Figure 5:
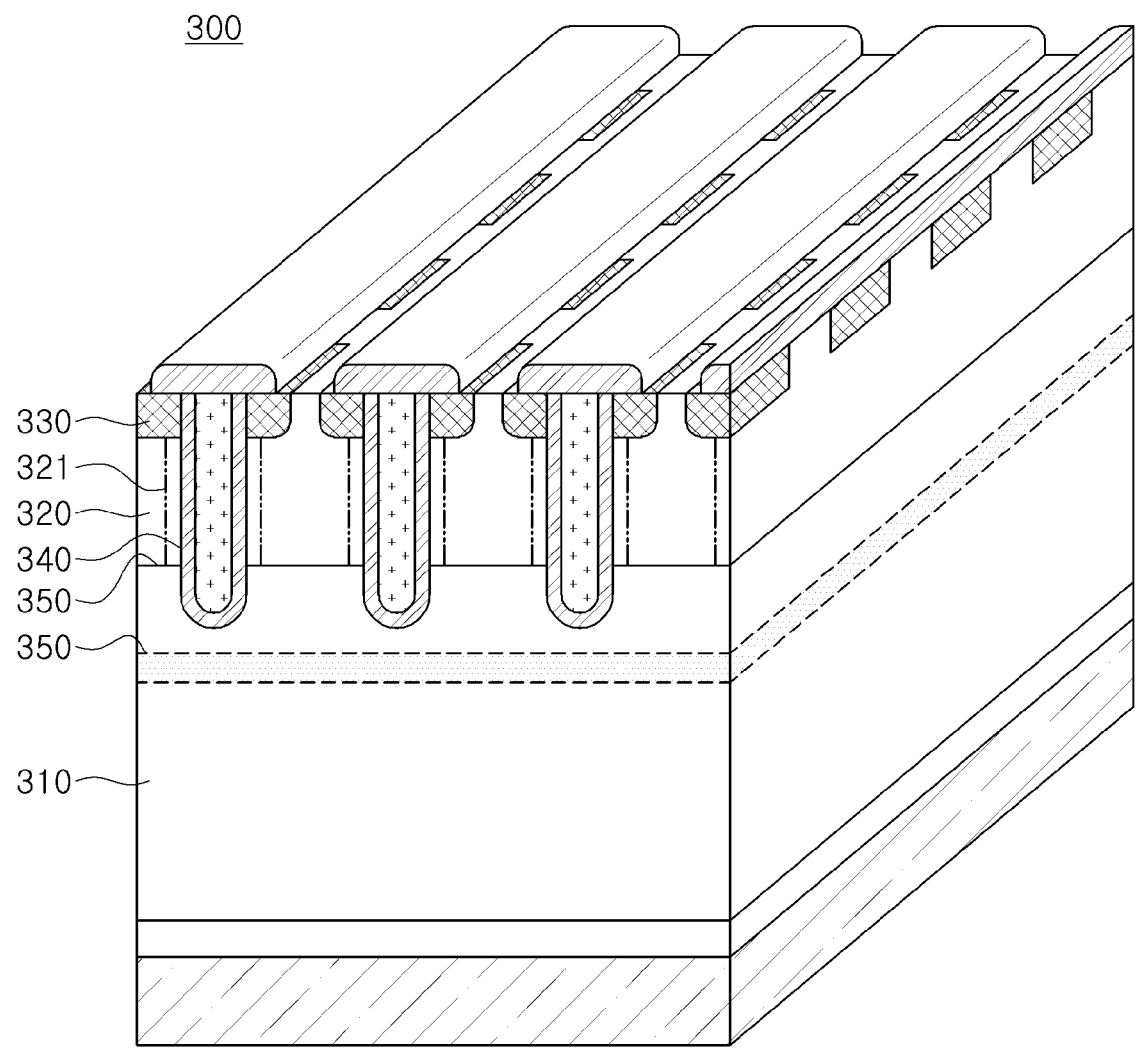
FIG. 5 is a schematic perspective view of a power semiconductor device according to a third exemplary embodiment of the present disclosure.

FIG. 5 is a schematic perspective view of a power semiconductor device 300 according to a third exemplary embodiment of the present disclosure.

Referring to FIG. 5, the power semiconductor device 300 according to a third exemplary embodiment of the present disclosure may include an n− type drift layer 310 in which trench gates 340 are formed; a p0 type well region 320 formed on the drift layer 310 so as to contact the trench gate 340; an n+ type source region 330 formed on the well region 320 so as to contact the trench gate 340; and a device protection region 350 formed below a height of a lowermost portion of the source region 330 in a height direction (z direction), wherein the device protection region 350 may be formed in the drift layer 310.

Since the device protection region 350 may be formed by injecting oxygen or nitrogen atoms, a blocking voltage of the drift layer 310 may be improved.

That is, the device protection region 350 may improve the blocking voltage of the drift layer 310 as well as an effect of permanently cutting off the cell in which a problem occurs when the problem such as the short-circuit or latch-up occurs.

Fourth Exemplary Embodiment

Figure 6:
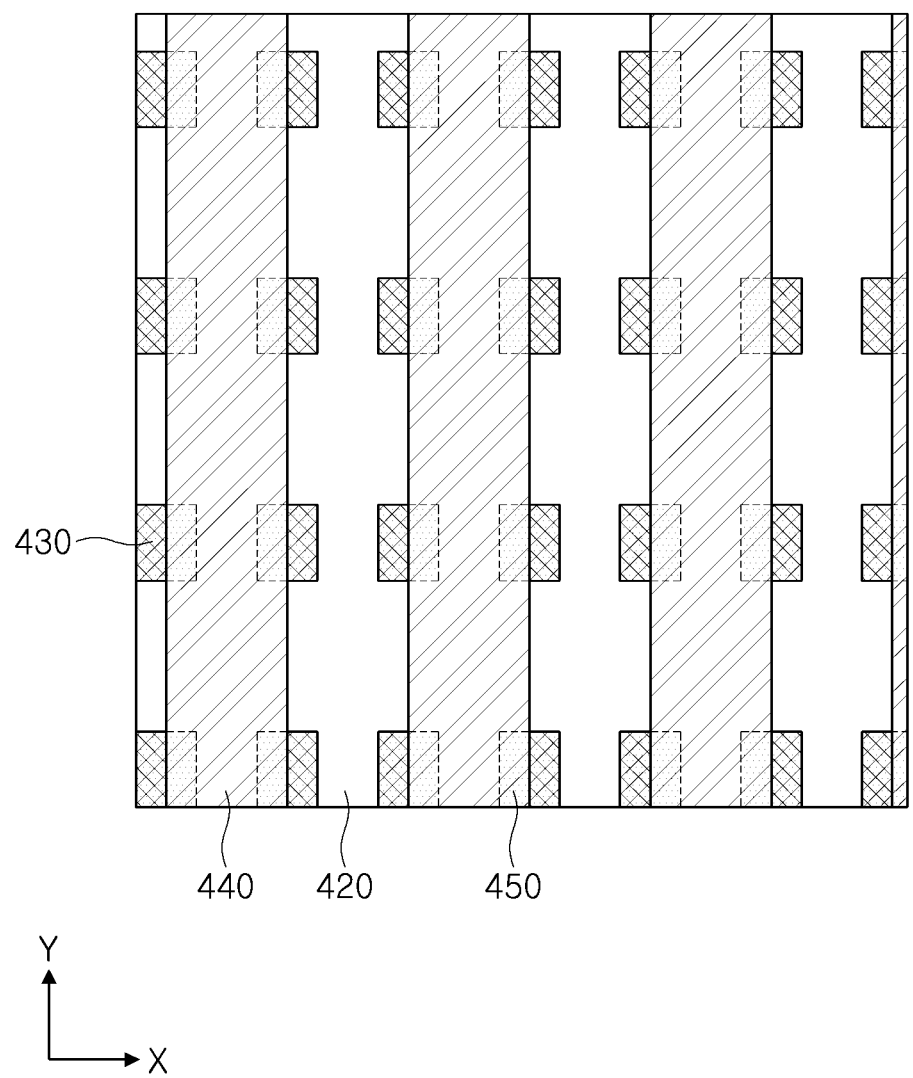
FIG. 6 is a schematic plan view of a power semiconductor device according to a fourth exemplary embodiment of the present disclosure.

FIG. 6 is a schematic plan view of a power semiconductor device 400 according to a fourth exemplary embodiment of the present disclosure.

Referring to FIG. 6, the power semiconductor device 400 according to a fourth exemplary embodiment may include an n− type drift layer; a plurality of trench gates 440 formed lengthwise in the drift layer to be spaced apart by a predetermined interval in one direction; a p0 type well region 420 formed between the plurality of trench gates 440; n+ type source regions 430 formed in the well region 420 to be spaced apart by a predetermined interval in one direction so as to contact the trench gate 440; and a device protection region 450 formed below a height of a lowermost portion of the source region 430 in a height direction, wherein the device protection region 450 may be formed below the source region 430.

As illustrated in FIG. 6, the device protection region 450 according to a fourth exemplary embodiment may be formed below the source region 430 so as to correspond to a position of the source region 430.

Since the device protection region 450 is a region into which oxygen or nitrogen atoms are injected, when the power semiconductor device 400 is turned on, the device protection region 450 may increase turn-on resistance.

In addition, when the problem such as the short-circuit or latch-up occurs in the cell of the power semiconductor device 400, since a current mainly flows through the source region 430, a junction corresponding to the source region 430 is frequently broken.

Therefore, an increase in the turn-on resistance of the power semiconductor device 400 may be prevented by forming the device protection region 450 below the source region 430 so as to correspond to the position of the source region 430. In addition, when the problem such as the short-circuit or latch-up occurs in a cell of the power semiconductor device 400, the cell at which the problem occurs may be permanently cut off by the device protection region 450, thereby preventing the entire power semiconductor device 400 from being broken.

In a fourth exemplary embodiment, the device protection region 450 may be formed below the source region and formed at at least one of a portion at which the drift layer and the well region contact each other, the drift layer, and the well region, as in first to third exemplary embodiments.

The resulting effect may be equal to that as described in first to third exemplary embodiments.

Fifth Exemplary Embodiment

Figure 7:
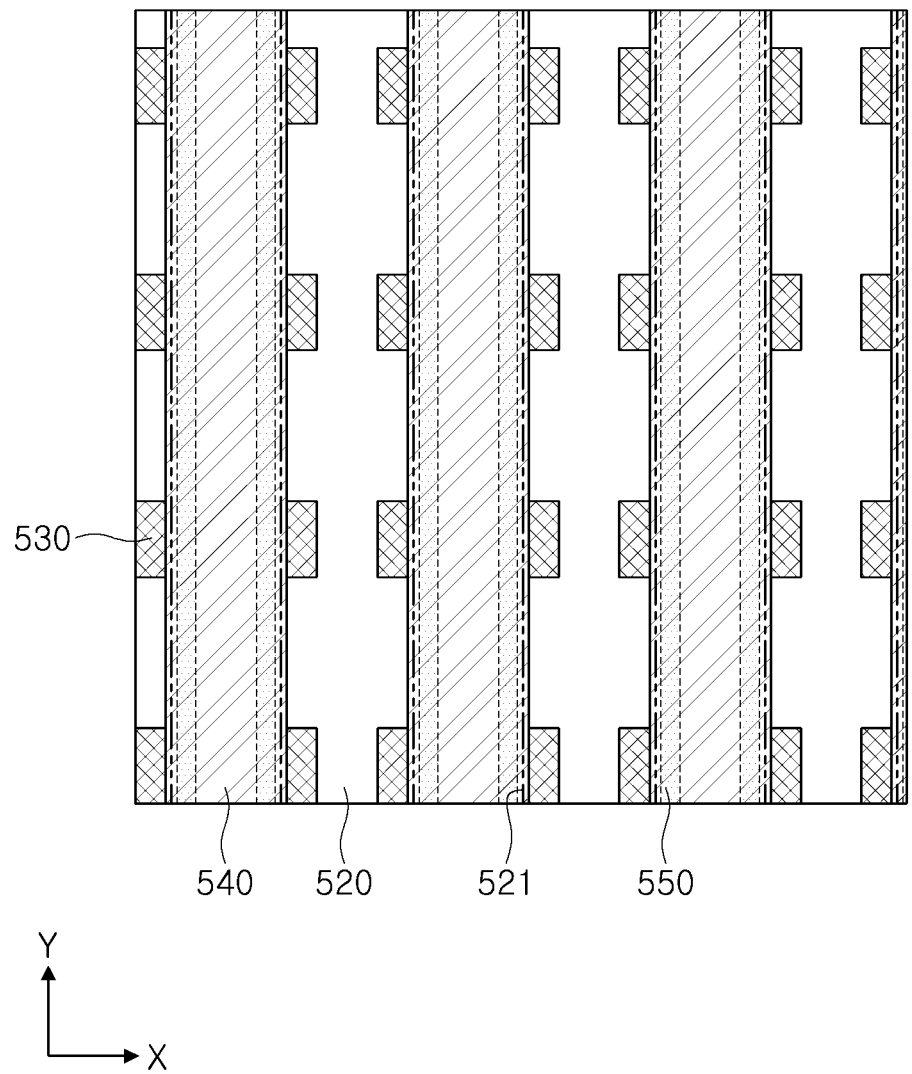
FIG. 7 is a schematic plan view of a power semiconductor device according to a fifth exemplary embodiment of the present disclosure.

FIG. 7 is a schematic plan view of a power semiconductor device 500 according to a fifth exemplary embodiment of the present disclosure.

Referring to FIG. 7, the power semiconductor device 500 according to a fifth exemplary embodiment may include an n− type drift layer; a plurality of trench gates 540 formed lengthwise in the drift layer to be spaced apart by a predetermined interval in one direction; a p0 type well region 520 formed between the plurality of trench gates 540; n+ type source regions 530 formed in the well region 520 to be spaced apart by a predetermined interval in one direction so as to contact the trench gate 540; and a device protection region 550 formed below a height of a lowermost portion of the source region 530 in a height direction, wherein the device protection region 550 may further include channel regions 521 formed portions of the well region 520 contacting the trench gates 540 when the device is turned on and be formed at positions corresponding to the channel regions 521.

That is, in the case in which the device protection region 550 is formed at the portion at which the drift layer and the well region 520 contact each other, the device protection region 550 may be formed below the channel region 521.

In addition, in the case in which the device protection region 550 is formed in the well region 520, the device protection region 550 may be formed in a portion of the channel region 521.

Finally, in the case in which the device protection region 550 is formed in the drift layer, the device protection region 550 may be formed below the channel region 521.

In the power semiconductor device 550, electron current flows through a conductive channel formed in the channel region 521 when a positive voltage is applied to the trench gate 540.

Therefore, a cell in which a short-circuit or latch-up occurs may be effectively cut off by forming the device protection region 550 at the positions corresponding to the channel region 521 in the x and y directions.

In a fifth exemplary embodiment, the device protection region 550 may be formed at the position corresponding to the channel region 521 and formed at at least one of a portion at which the drift layer and the well region contact each other, the drift layer, and the well region, as in first to third exemplary embodiments.

The resulting effect may be equal to that as described in first to third exemplary embodiments.

Sixth Exemplary Embodiment

Figure 8:
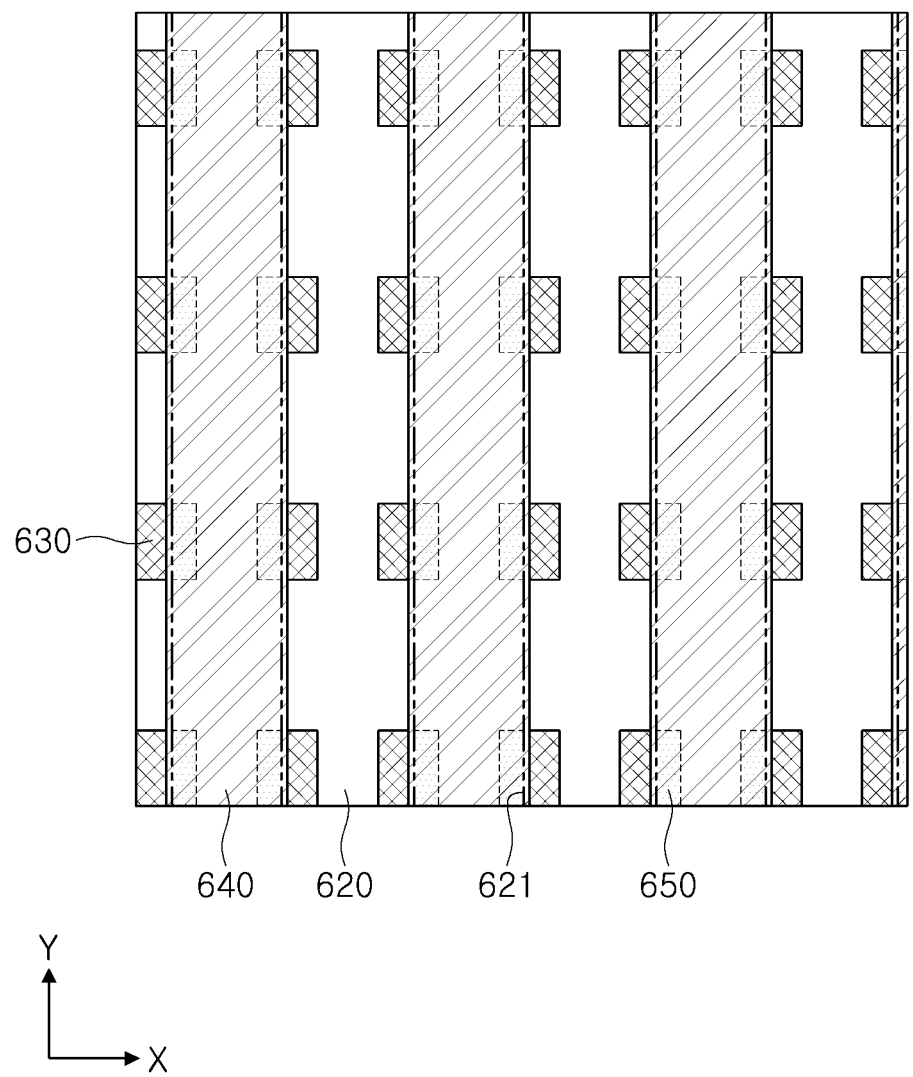
FIG. 8 is a schematic plan view of a power semiconductor device according to a sixth exemplary embodiment of the present disclosure.

FIG. 8 is a schematic plan view of a power semiconductor device 600 according to a sixth exemplary embodiment of the present disclosure.

Referring to FIG. 8, the power semiconductor device 600 according to a sixth exemplary embodiment may include an n− type drift layer; a plurality of trench gates 640 formed lengthwise in the drift layer to be spaced apart by a predetermined interval in one direction; a p0 type well region 620 formed between the plurality of trench gates 640; n+ type source regions 630 formed in the well region 620 to be spaced apart by a predetermined interval in one direction so as to contact the trench gate 640; and a device protection region 650 formed below a height of a lowermost portion of the source region 630 in a height direction, wherein the device protection region 650 may be formed below the source region 630 and formed at positions corresponding to channel regions 621.

The device protection region 650 may be formed at positions corresponding to the channel region 621 in the x direction and formed at positions corresponding to the source regions 630 in the y direction.

That is, the device protection region 650 may be formed at positions through which the current mostly flows when the problem such as the short-circuit or latch up occurs.

Therefore, breakage of the entire power semiconductor device 600 may be prevented by effectively cutting off a cell in which the problem such as the short-circuit or latch-up occurs while decreasing an area of the device protection region 650 to prevent turn-on resistance of the power semiconductor device 600 from being increased.

In a sixth exemplary embodiment, the device protection region 650 may be formed at at least one of a portion at which the drift layer and the well region contact each other, the drift layer, and the well region, as in first to third exemplary embodiments.

The resulting effect may be equal to that as described in first to third exemplary embodiments.

As set forth above, according to exemplary embodiments of the present disclosure, the device protection region is formed at the portion at which the well region and the drift layer contact each other or in the drift layer, such that when the latch-up or short-circuit occurs in the cell present in the device, the corresponding cell may be electrically cut off.

In detail, the oxygen or nitrogen atom is injected into the device protection region, such that in the case in which a high level of heat is generated due to the latch-up or short-circuit in the corresponding cell, silicon may react with the oxygen or nitrogen atom to form silicon oxide ($SiO_2$) or silicon nitride (SiN), such that the corresponding cell may be electrically cut off.

The cell in which the problem occurs may be electrically cut off before breakage of the cell, subsequent breakage of cells adjacent thereto may be prevented, thereby improving reliability and durability of the device.

While exemplary embodiments have been shown and described above, it will be apparent to those skilled in the art that modifications and variations could be made without departing from the spirit and scope of the present disclosure as defined by the appended claims.

What is claimed is:

1. A power semiconductor device comprising;
a first conductive type drift layer;
trench gates of same type next to each other including gate insulating layers disposed on respective sidewall and bottom surfaces thereof;
a second conductive type well region disposed on the drift layer so as to contact the gate insulating layers;
a-first conductive type source regions disposed on the well region so as to contact the gate insulating layers;
channel regions formed in a portion of the well region contacting the trench gates when the device is turned on; and
a device protection region disposed below a height from a lowermost portion of the source regions in a height direction, disposed between the drift layer and the well region, contacting the trench gates, and insulating the channel regions directly when latch-up or a short-circuit occurs,
the trench gates penetrating through the well region, the source regions and the device protection region.

2. The power semiconductor device of claim 1, wherein the device protection region is formed below the source regions.

3. The power semiconductor device of claim 1, wherein the device protection region is formed in a portion of the channel regions.

4. The power semiconductor device of claim 1, wherein the device protection region contains at least one of an oxygen atom and a nitrogen atom.

5. The power semiconductor device of claim 1, wherein the device protection region is changed to have insulation properties when the latch-up or the short-circuit occurs.

6. A power semiconductor device comprising:

a first conductive type drift layer;

a plurality of trench gates of same type next to each other formed lengthwise in the drift layer to be spaced apart by a predetermined interval in one direction, and including gate insulating layers disposed respectively on sidewall and bottom surfaces thereof;

a second conductive type well region disposed on the drift layer so as to contact the gate insulating layers;

first conductive type source regions disposed in the well region to be spaced apart by a predetermined interval in one direction so as to contact the gate insulating layers;

channel regions formed in a portion of the well region contacting the trench gates when the device is turned on; and a device protection region disposed below a height from a lowermost portion of the source regions in a height direction, disposed between the drift layer and the well region, contacting the trench gates, and insulating the channel region directly when latch-up or a short-circuit occurs, the trench gates penetrating through the well region, the source regions and the device protection region.

7. The power semiconductor device of claim 6, wherein the device protection region is formed below the source regions.

8. The power semiconductor device of claim 6, wherein the device protection region is formed in a portion of the channel regions.

9. The power semiconductor device of claim 6, wherein the device protection region is formed below the channel regions.

10. The power semiconductor device of claim 6, wherein the device protection region contains at least one of an oxygen atom and a nitrogen atom.

11. The power semiconductor device of claim 6, wherein the device protection region is changed to have insulation properties when the latch-up or the short-circuit occurs.

* * * * *